(12) United States Patent
Sbiaa et al.

(10) Patent No.: US 7,206,174 B2
(45) Date of Patent: Apr. 17, 2007

(54) MAGNETORESISTANCE EFFECT ELEMENT COMPRISING NANO-CONTACT PORTION NOT MORE THAN A FERMI LENGTH, METHOD OF MANUFACTURING SAME AND MAGNETIC HEAD UTILIZING SAME

(75) Inventors: Rachid Sbiaa, Tokyo (JP); Isamu Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/882,179

(22) Filed: Jul. 2, 2004

(65) Prior Publication Data
US 2005/0068687 A1    Mar. 31, 2005

(30) Foreign Application Priority Data
Sep. 30, 2003    (JP)    ............. P2003-342457

(51) Int. Cl.
*G11B 5/39* (2006.01)
(52) U.S. Cl. ............... 360/324.1; 360/324.11
(58) Field of Classification Search ........... 360/324.1, 360/324.11, 324.12, 324.2
See application file for complete search history.

(56) References Cited

U.S. PATENT DOCUMENTS

| | | | | |
|---|---|---|---|---|
| 5,715,121 A | * | 2/1998 | Sakakima et al. | 360/324.2 |
| 5,936,402 A | * | 8/1999 | Schep et al. | 324/252 |
| 6,046,891 A | * | 4/2000 | Yoda et al. | 360/324.1 |
| 6,052,262 A | * | 4/2000 | Kamiguchi et al. | 360/324.12 |
| 6,077,618 A | * | 6/2000 | Sakakima et al. | 428/693 |
| 6,452,764 B1 | * | 9/2002 | Abraham et al. | 360/324.2 |
| 6,590,750 B2 | * | 7/2003 | Abraham et al. | 360/324.2 |
| 6,731,475 B2 | * | 5/2004 | Ikeda | 360/322 |
| 6,787,369 B2 | * | 9/2004 | Ishii et al. | 438/3 |
| 6,804,090 B2 | * | 10/2004 | Kokado | 360/324.2 |
| 6,937,447 B2 | * | 8/2005 | Okuno et al. | 360/324.1 |

(Continued)

FOREIGN PATENT DOCUMENTS

JP    11-510911    9/1999

(Continued)

OTHER PUBLICATIONS

N. Garcia, et al., Magnetoresistance In Excess Of 200% In Ballistic Ni Nanocontacts At Room Temperature And 100 Oe, Physical Review Letters, Apr. 5, 1999, 2923-2926, vol. 82, No. 14, © 1999 The American Physical Society.

(Continued)

*Primary Examiner*—Jefferson Evans
(74) *Attorney, Agent, or Firm*—Kenyon & Kenyon LLP (57) ABSTRACT

A magnetoresistance effect element is manufactured in the steps in which a first ferromagnetic layer is formed on a substrate, the first ferromagnetic layer is patterned to form a pinned layer, in the shape of a strip, having both end portions to which electrode pads are formed, the pinned layer is etched, for example, through ion milling, so as to form at least one nano-contact portion, an insulating layer is formed by embedding an insulating material into the etched pinned layer around the nano-contact portion, a second ferromagnetic layer is formed so as to contact at least the nano-contact portion, and this second ferromagnetic layer is patterned to form a free layer, in shape of strip, having both end portions to which electrode pads are formed.

9 Claims, 7 Drawing Sheets

U.S. PATENT DOCUMENTS

| | | | |
|---|---|---|---|
| 6,961,223 B2 * | 11/2005 | Hasegawa | 360/322 |
| 7,035,062 B1 * | 4/2006 | Mao et al. | 360/324.2 |
| 2002/0017018 A1 * | 2/2002 | Ohkawara | 29/603.18 |
| 2002/0024775 A1 * | 2/2002 | Hasegawa | 360/314 |
| 2003/0104249 A1 | 6/2003 | Okuno et al. | 428/693 |
| 2004/0201929 A1 * | 10/2004 | Hashimoto et al. | 360/324.1 |

FOREIGN PATENT DOCUMENTS

| | | |
|---|---|---|
| JP | 2003-204095 | 7/2003 |

OTHER PUBLICATIONS

N. Garcia, et al., Ballistic Magnetoresistance In Nanocontacts Electrochemically Grown Between Macro- and Microscopic Ferromagnetic Electrodes, Applied Physics Letters, Mar. 11, 2002, 1785-1787, vol. 80, No. 10, © American Institute of Physics.

* cited by examiner

MAGNETORESISTANCE EFFECT ELEMENT COMPRISING NANO-CONTACT PORTION NOT MORE THAN A FERMI LENGTH, METHOD OF MANUFACTURING SAME AND MAGNETIC HEAD UTILIZING SAME

BACKGROUND OF THE INVENTION

1. Field of the Invention

The present invention relates to a magnetoresistance (or magneto-resistance) effect element particularly provided with Ballistic Magneto Resistance (BMR) effect, to a method of manufacturing such magnetoresistance effect element and to a magnetic head provided with such magnetoresistance effect element.

2. Relevant Art

Generally, a giant magnetoresistance effect (GMR effect) is a phenomenon indicating rate of change in magnetoresistance (called herein magnetoresistance ratio) which is developed or reviled in a case that electric current passes in a plane of a lamination structure of ferromagnetic layer/non-magnetic layer/ferromagnetic layer. Moreover, the magnetoresistance effect element of such GMR has been further actively studied for the development of more large magnetoresistance ratio, and up to now, ferromagnetic tunnel junction and a CPP (Current Perpendicular to Plane)-type MR element, in which the current passes perpendicularly with respect to the lamination structure, have been developed, and hence, has high degree of expectation for reproducing (regenerative) element for magnetic sensor, magnetic recording element and the like.

In the field of the magnetic recording technology, according to improvement of recording density, there a continuous progress in making compact recording bits, and as its result, it becomes difficult to obtain a sufficient signal strength. Thus, taking such matters into consideration, it has been desired for engineers in this field to search a material having high sensitive magnetoresistance effect and develop or revile an element indicating a large magnetoresistance ratio.

Recently, there have been reported, as material indicating magnetoresistance effect of more than 100%, "magnetic micro contact" which is formed by butting two needle-like nickel (Ni) as shown, for example, in a document of "Physical Review Letters, vol. 82, p 2923 (1999), by N. Garcia, M. Munoz, and Y. W. Zhao" (Document 1). This magnetic micro contact is manufactured by butting two ferromagnetic materials worked in form of needle or in form of triangle. More recently, there has been developed a magnetic micro contact in which two fine Ni wires are arranged in T-shape and micro column is grown at a contact portion of these wires by electro-deposition method (for example, refer to a document of "Appl. Phys. Lett. Vol. 80, p 1785 (2002), by N. Garcia, G. G. Qian, and I. G. Sveliev" (Document 2).

It is considered that an extremely high MR (Magneto Resistance) ratio developing such element is based on spin transport of a magnetic area existing in the magnetic micro contact formed between two ferromagnetic layers having magnetized directions in anti-parallel to each other. It is considered that, in the magnetoresistance effect element utilizing the magnetic micro contact having such characteristics, since electrons pass without receiving any scattering or diffusion due to impurities (i.e., pass ballistically), such magnetoresistance effect element is called BMR element (Ballistic Magneto Resistance element).

In addition, more recently, there has also been reported a magnetoresistance effect element having such magnetic micro contact. For example, in Japanese Patent Laid-open (KOKAI) Publication No. 2003-204095 (Document 3), there is reported a magnetoresistance effect element composed of first ferromagnetic layer/insulating layer/second ferromagnetic layer, in which the first ferromagnetic layer is connected to the second ferromagnetic layer at a predetermined portion of the insulating layer, the magnetoresistance effect element being provided with a hole having an opening having the maximum diameter of less than 20 nm. Furthermore, in Japanese Patent Application National Publication (Laid-open) No. HEI 11-510911 (Document 4), there is reported a magneto-resistance effect element composed of two magnetic layers connected to each other through a narrow segment having a width of about 100 nm.

However, in consideration of application of a BMR element to a magnetic head, a dimension of a free layer sensitive to magnetic field leaking from a surface of a medium is made small such as, for example, to several tens nanometers. For example, in a case of recording density of 1 Tbits/in2, such dimension is of 40 to 50 nm, and in a case of a BMR element capable of realizing an extremely high MR ratio, a structure of a magnetic domain of the magnetic micro contact (called hereinlater "nano-contact portion") is a "key" of the BMR effect. As the miniaturization progresses, strong demagnetizing magnetic field is generated from the end face of the thin free layer, which results in that any magnetic stability is hardly obtainable and thermal stability is extremely lowered, being inconvenient and disadvantageous.

Therefore, in the BMR element, it is an extremely important object to provide a practically usable BMR element capable of ensuring the magnetic domain control and magnetic stability thereof and also provide a manufacturing method of such BMR element.

SUMMARY OF THE INVENTION

An object of the present invention is to substantially eliminate defects or drawbacks encountered in the prior art mentioned above and to provide a magnetoresistance effect element, particularly for a magnetic head, having BMR effect capable of achieving improved stability and sensitivity of a free layer and a magnetic domain of a nano-contact portion constituting the magnetoresistance effect element and also provide a method of suitably manufacturing such magneto-resistance effect element.

Another object of the present invention is to also provide a magnetic head with such magnetoresistance effect element which is manufactured by the method of the present invention.

These and other objects can be achieved according to the present invention by providing, in one aspect, a magnetoresistance effect element comprising:

a substrate;

a layer lamination structure including a first ferromagnetic layer formed as the pinned layer in shape of strip, at least one nano-contact portion formed to the first ferromagnetic layer so as to have a dimension of not more than Fermi length, an insulating layer embedded in the first ferromagnetic layer around the nano-contact portion, and a second ferromagnetic layer disposed on the insulating layer and formed as the free layer in shape of strip, which are laminated in this order on the substrate; and electrode pads formed at both end portions of the first and second ferromagnetic layers, respectively.

According to this aspect of the present invention, since at least one (one or more than one) nano-contact portion having a maximum dimension of not more than Fermi length is disposed between the first and second ferromagnetic layers, the signal detection with high sensitivity can be realized by the BMR effect, and in addition, the magnetic domain structure control and the magnetic stability can be effectively made by the magnetostatic energy reduction and the suppression of the magnetostatic charge appearing at the end surface of the lamination structure.

In preferred embodiments or examples of this aspect, the magnetoresistance effect element may further comprise an anti-ferromagnetic layer disposed between the substrate and the first ferromagnetic layer. The magnetoresistance effect element may further comprise a shield layer disposed between the substrate and the anti-ferromagnetic layer, and the element may further comprise a top shield layer disposed on the second ferromagnetic layer. External electrodes may be further formed on the electrode pads.

It may be preferred that first ferromagnetic layer formed as the pinned layer is composed of either one of a single ferromagnetic layer and two ferromagnetic layers between which a non-magnetic layer is disposed, and the second ferromagnetic layer formed as the free layer is composed of either one of a single ferromagnetic layer and two ferromagnetic layers between which a non-magnetic layer is disposed.

A plurality of first ferromagnetic layers, each in shape of strip, may be provided on the substrate.

The first and second ferromagnetic layers may be formed of the same material having a polarization of not less than 0.5 or materials different from each other and having a polarization of not less than 0.5.

The first and second ferromagnetic layers, both in shape of strip, are arranged to be normal to each other.

According to the above preferred embodiments or examples, the anti-ferromagnetic layer is coupled to the first ferromagnetic layer forming the pinned layer, which acts to fix its magnetization. As a result, the stability of the entire structure of the magnetoresistance effect element can be ensured.

Furthermore, the pinned layer and/or free layer may be composed of two ferromagnetic layers and a single non-magnetic layer disposed therebetween. In this lamination structure, two ferromagnetic layers are anti-ferromagnetically coupled, thus the magnetization thereof can be stabilized. Accordingly, the leaking of the magnetic field through the side end surface of the layer structure can be prevented, and hence, the stability of the entire structure of the magnetoresistance effect element can be further ensured.

In another aspect of the present invention, to achieve the above-mentioned objects, there is provided a method of manufacturing a magnetoresistance effect element comprising the steps of:

preparing a substrate;

forming a first ferromagnetic layer on the substrate;

patterning the first ferromagnetic layer so as to form a pinned layer, in shape of strip, having both end portions to which electrode pads are formed;

etching the pinned layer so as to form at least one nano-contact portion;

embedding an insulating material to the etched pinned layer so as to form an insulating layer around the nano-contact portion;

forming a second ferromagnetic layer so as to contact at least the nano-contact portion; and patterning the second ferromagnetic layer so as to form a free layer, in shape of strip, having both end portions to which electrode pads are formed.

According to this aspect, the nano-contact portion is formed to the first ferromagnetic layer forming the pinned layer by etching the same and the second ferromagnetic layer is formed so as to contact the nano-contact portion through the patterning step of film forming step, so that the magnetoresistance effect element having high stability in the magnetic domain of the nano-contact portion and the free layer with high sensitivity.

The magnetoresistance effect element obtained by this method can provide the advantageous effects and functions as mentioned above.

In preferred embodiments or example of this aspect, an anti-ferromagnetic layer may be further formed on the substrate before the formation of the first ferromagnetic layer.

The first ferromagnetic layer forming step may include a formation of either one of cases of forming a single ferromagnetic layer and forming two ferromagnetic layers between which a non-magnetic layer is further formed.

The etching step to the pinned layer to form the nano-contact portion may be done by ion milling in a manner such that the maximum dimension of the nano-contact portion is not more than Fermi length.

A plurality of pinned layers, each in shape of strip, provided at both end thereof with the electrode pads, may be formed on the substrate in the patterning step for forming the pinned layer.

The second ferromagnetic layer forming step may include a formation of either one of cases of forming a single ferromagnetic layer and forming two ferromagnetic layers between which a non-magnetic layer is further formed.

The magnetoresistance effect element manufacturing method may further comprise the step of forming external electrodes on the electrode pads, respectively.

The ferromagnetic layers of the pinned layer and the free layer, as well as the nano-contact portion, each may preferably be formed of a material selected from the groups consisting of a ferromagnetic metal group of Co, Fe, Ni, CoFe, NiFe, CoFeNi; a ferromagnetic metalloid group of $CrO_2$; and ferromagnetic oxide of $Fe_3O_4$.

According to the above preferred embodiments or examples, the magnetoresistance effect element having advantageous effects and functions as mentioned above could be preferably obtained.

Still furthermore, in a further aspect of the present invention, there is further provided a magnetic head comprising:

a magnetoresistance effect element comprising a substrate, and a layer lamination structure including a first ferromagnetic layer formed as the pinned layer in shape of strip, at least one nano-contact portion formed to the first ferromagnetic layer so as to have a dimension of not more than Fermi length, an insulating layer embedded in the first ferromagnetic layer around the nano-contact portion, and a second ferromagnetic layer disposed on the insulating layer and formed as the free layer in shape of strip, which are laminated in this order on the substrate, and in which electrode pads are formed at both end portions of the first and second ferromagnetic layers, respectively;

electrodes disposed on both sides of the magnetoresistance effect element; and a pair of shield members disposed on outside surfaces of the electrodes, respectively.

According to this magnetic head, the magnetoresistance effect element of the characters and structures mentioned above is utilized, which is manufactured by the method of the characters mentioned above, so that the magnetic head having high stability and high performance would be obtainable.

The nature and further characteristic features of the present invention will be made more clear from the following descriptions made with reference to the accompanying drawings.

BRIEF DESCRIPTION OF THE DRAWINGS

In the accompanying drawings:

FIG. 2 (FIGS. 2A and 2B) is an illustrated sectional view of one example of a layer lamination structure after a step of forming the first ferromagnetic layer on the anti-ferromagnetic layer of FIG. 1;

FIG. 3 (FIGS. 3A to 3F) is an illustrated sectional (or plan) view of one example of a lamination structure for explaining a patterning step;

FIG. 4 (FIGS. 4A to 4E) is an illustrated sectional (or plan) view of one example of a step of forming a nano-contact portion;

FIG. 5 (FIGS. 5A to 5C) is an illustrated sectional (or plan) view for a step of forming an insulating layer in an etched first ferromagnetic layer;

FIG. 6 (FIGS. 6A to 6D) is an illustrated sectional (or plan) view for a step of forming a second ferromagnetic layer so as to contact the nano-contact portion;

FIG. 7 (FIGS. 7A and 7B) is an illustrated sectional view for a step of forming electrodes on electrode pads, which constitutes one preferred embodiment of a magnetoresistance effect element according to the present invention;

DESCRIPTION OF THE PREFERRED EMBODIMENTS

Preferred embodiments of a magnetoresistance effect element, a method of manufacturing the same and a magnetic head utilizing it according to the present invention will be described hereunder with reference to the accompanying drawings.

Figure 7A:
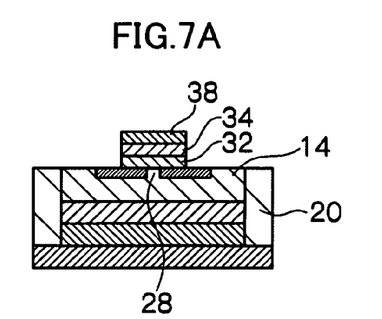
Figure 7B:
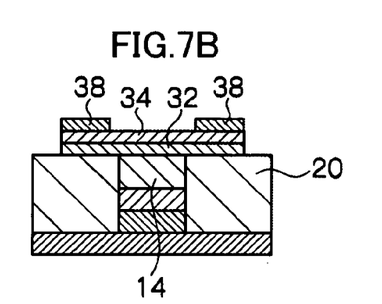

One example of a magnetoresistance effect element according to the present invention is shown in FIG. 7 as a sectional view showing a layer lamination structure thereof.

That is, although the magnetoresistance effect element of this embodiment will be described in detail hereinlater, it generally comprises a substrate and a layer lamination structure including a first ferromagnetic layer formed as the pinned layer, one or more than one (i.e., at least one) nano-contact portion, an insulating layer, and a second ferromagnetic layer, which are laminated in this order on the substrate, and in which the first and second ferromagnetic layers are each provided with electrode pads formed to both ends thereof.

In a more compact structure, the magneto-resistance effect element of the present invention comprises the first ferromagnetic layer forming the pinned layer, the nano-contact portion, and the second ferromagnetic layer forming the free layer, the nano-contact portion being disposed between the first and second ferromagnetic layers and as well as insulating layer.

The details of the respective constitutional elements or layers of the magnetoresistance effect element will be made more clear through the following description of manufacturing steps of the magnetoresistance effect element with reference to FIGS. 1 to 8.

This manufacturing method is generally composed of an anti-ferromagnetic layer forming step, a first ferromagnetic layer forming step, a patterning step, a nano-contact portion forming step, an insulating layer forming step and a second ferromagnetic layer forming step, which will be explained in detail hereunder, respectively.

[Anti-Ferromagnetic Layer Forming Step]

Figure 1:
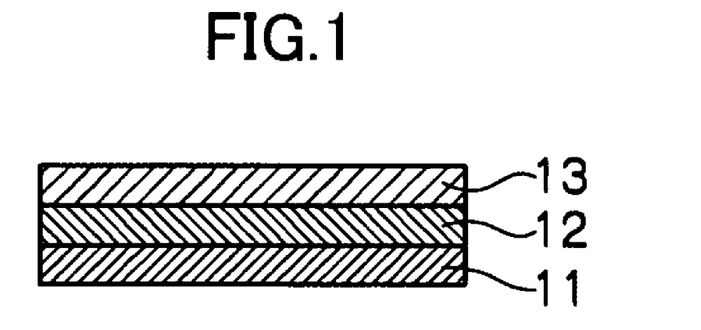
FIG. 1 is an illustrated sectional view of one example of a layer lamination structure after a step of forming an anti-ferromagnetic layer on a substrate.
Figure 2A:
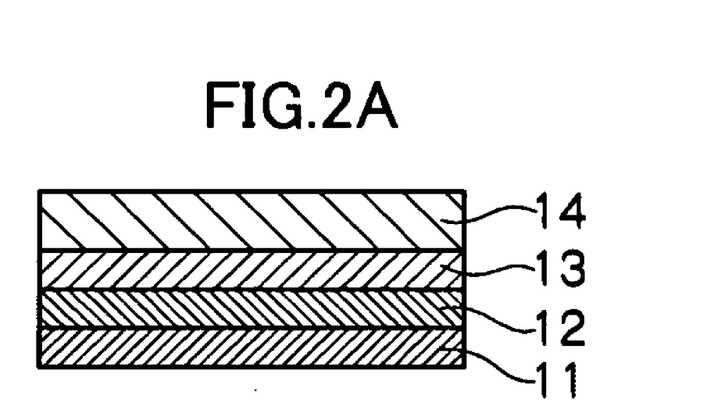

FIG. 1 is an illustrated sectional view of one example of a layer lamination structure after the forming of the anti-ferromagnetic. This step is one for forming an anti-ferromagnetic layer 13 on a substrate 11, which is desired to be carried out before the first ferromagnetic layer forming step, which will be explained hereinlater. Accordingly, the anti-ferromagnetic layer 13 is formed between the substrate 11 and the first ferromagnetic layer 14 as shown in FIG. 2A

As the substrate 11, on which the anti-ferromagnetic layer 13 is formed, there may be utilized a Si substrate, a Si oxide substrate, an AlTiC substrate or like, and in usual, a shield layer 12, having a thickness of about 1 to 2 mm, may be formed on the substrate 11. It may be preferred that such shield layer 12 is formed of NiFe, NiFeMo or like material.

The anti-ferromagnetic layer 13 is formed of a material selected from the group consisting of PtMn, IrMn, PtPdMn and FeMn through the sputtering or ion beam deposition so as to provide a film thickness, in usual, of about 2 to 20 nm.

According to the arrangement of such anti-ferromagnetic layer 13, by exchange coupling the magnetization of the ferromagnetic layer 14 constituting the pinned layer can be fixed. [First Ferromagnetic Layer Forming Step]

Figure 2B:
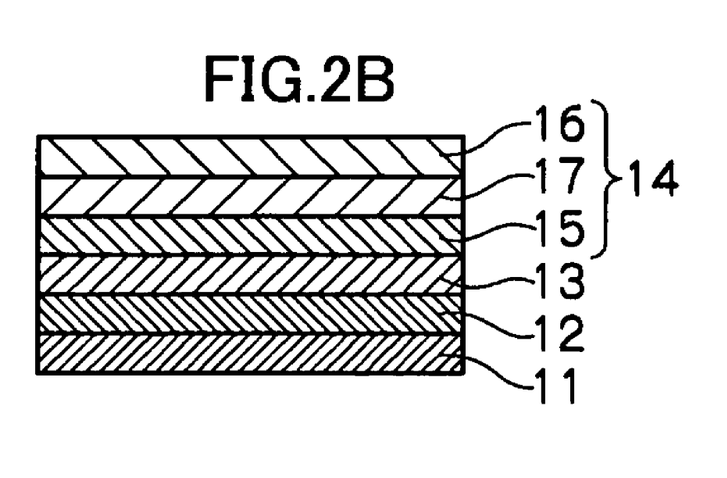

FIGS. 2A and 2B are illustrated sectional views of examples of layer lamination structures after the first ferromagnetic layer 14 is formed.

In this first ferromagnetic layer forming step, the first ferromagnetic layer 14 is deposited on the substrate 11, and preferably, on the anti-ferromagnetic layer 13, such as formed in the former anti-ferromagnetic layer forming step shown in FIG. 1, so as to be contacted thereto. Note that also using a hard magnet flowed by a spacer such Ru, Rh then a pinned layer 14 can also be used. In this case the anti-ferromagnetic layer is not needed.

The first ferromagnetic layer 14 may be composed of single ferromagnetic layer as shown in FIG. 2A, or three layers including two ferromagnetic layers 15 and 16 and a non-magnetic layer 17 disposed between these two ferromagnetic layers 15 and 16 as shown in FIG. 2B.

Further, the example shown in FIG. 2B will be preferred, in which the ferromagnetic layer 15, the non-magnetic layer 17 and the ferromagnetic layer 16 are formed, in this order, on the anti-ferromagnetic layer 13.

In the ease of the single ferromagnetic layer 14 of FIG. 2A, although various kinds of ferromagnetic materials, which especially provide a spin polarization of not less than 0.5, may be utilized, it is desirable to select the material from the following groups of ferromagnetic metal group: Co; Fe; Ni; CoFe; NiFe; CoFeNi; ferromagnetic metalloid group: $CrO_2$; ferromagnetic oxide group: $Fe_3O_4$; and so on, in which CoFe or NiFe will be selected as more preferable ferromagnetic material.

This single ferromagnetic layer 14 is usually formed through the sputtering or ion beam deposition so as to provide a film thickness of 0.5 to 5 nm.

On the other hand, in the case of the first ferromagnetic layer 14 including the two ferromagnetic layers 15 and 16 and the non-magnetic layer 17 disposed between these two ferromagnetic layers 15 and 16 as shown in FIG. 2B, these two ferromagnetic layers 15 and 16 may be formed of a material such CoFe or NiFe or having at least one of the elements Co, Ni or Fe. Further, in such case, these two ferromagnetic layers 15 and 16 are formed of the same material or materials different from each other through the sputtering or ion beam deposition process so as to provide a film thickness of 0.5 to 5 nm, in usual.

The non-magnetic layer 17 between these ferromagnetic layers 15 and 16 is formed of a material selected from the group consisting of Ru, Rh, Ir, Cu, Ag, or Au, or an alloy thereof through the sputtering or ion beam deposition so as to provide a film thickness of, in usual, 0.2 to 2 nm.

The two ferromagnetic layers 15 and 16 sectioned by the interposed non-magnetic layer 17 have axes of easy magnetizations which are coupled anti-ferromagnetically. Thus, according to the function of this non-magnetic layer 17, the magnetizations of these two ferromagnetic layers 15 and 16 can be stabilized, and as a result, any magnetic field does not leak from the side end surface of the layer structure, thus improving the stability of the entire structure of the magnetoresistance effect element.

[Patterning Step]

The patterning step is a step for forming a pinned layer in shape of strip having both ends to which electrode pads are formed. This patterning step will be described hereunder with reference to the illustrations of FIGS. 3A to 3F.

Figure 3A:
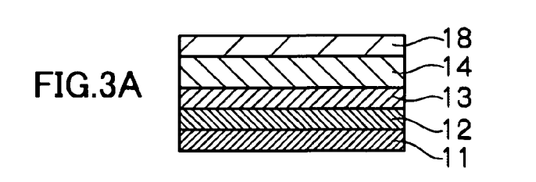

Referring to FIG. 3A, a resist film 18 is applied on the first ferromagnetic layer 14, and thereafter, an exposure of, for example, electron beam, is effected by using a mask to which a predetermined pattern is formed.

Figure 3B:
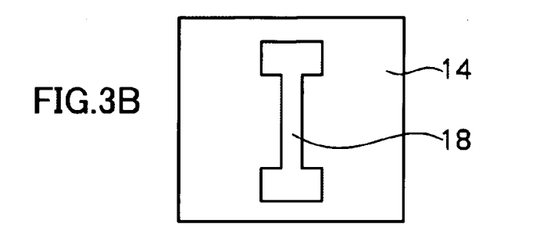

As such pattern shape, FIG. 3B shows an approximately strip shape, as a plan view, having areas (portions) corresponding to the electrode pads. In the next step, a portion of the resist film 18, to which etching, such as ion milling process, will be done, is removed. This state is illustrated in FIG. 3B.

Figure 3C:
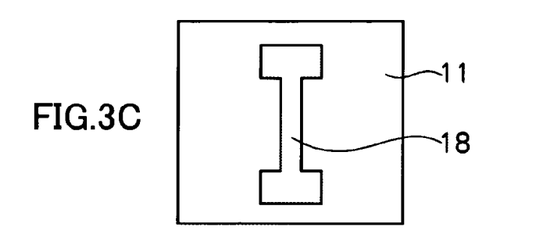

With reference to FIG. 3C, thereafter, the exposed portion is etched by, preferably, ion milling process, to remove portions to which the patterned resist film 18, in the shield layer 12, the anti-ferromagnetic layer 13 and the first ferromagnetic layer 14, which are formed on the substrate 11.

Figure 3D:
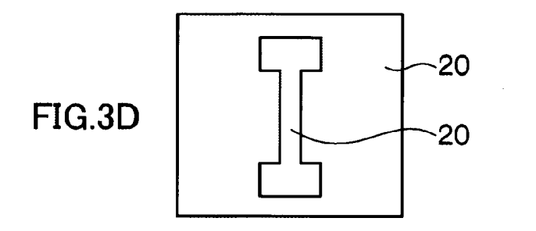

Next, as shown in FIG. 3D as a plan view, an insulating layer 20 in form of film is applied on the entire surface of the layer structure. This insulating layer 20 is composed of an oxide such as aluminum oxide, silicon oxide or like, or a nitride such as silicone nitride.

Figure 3E:
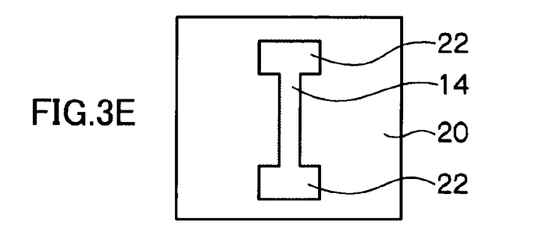
Figure 3F:
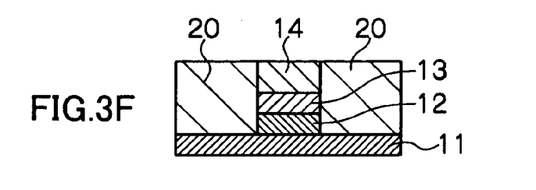

Finally, the insulating layer 20 formed on the resist film 18 is removed through a lift-off process. According to these processes, as shown in FIGS. 3E and 3F as plan views, there appears, on the front (top) surface, the first ferromagnetic layer 14 in shape of strip having electrode pad portions 22 at both end portions thereof. This first ferromagnetic layer 14 functions as the pinned layer.

Although the patterning step is carried out in accordance with the processes or steps mentioned above, the present invention is not limited to such embodiment. In one possible modification, a plurality of first ferromagnetic layers 14, each in shape of strip and having electrode pads at the end portions thereof, may be formed on the substrate 11, and it may be preferred that such ferromagnetic layers 14 are disposed in parallel to each other.

[Nano-Contact Portion]

The nano-contact portion 28 of the magnetoresistance effect element 10 is manufactured by the steps shown in FIG. 4A to 4E as sectional views or plan views corresponding, in position, to the plan view of FIG. 3E turned by 90 degrees.

These steps constitutes a process for forming one or more than one (at least one) nano-contact portions 28 by etching the first ferromagnetic layer 14 which was subjected to the patterning process, as mentioned above, i.e., through the ion milling process, in the manner that the nano-contact portion 28 thus formed provides the maximum length (dimension) of not more than Fermi length.

Figure 4A:
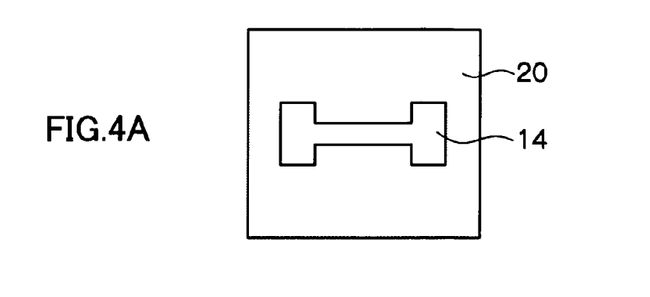
Figure 4B:
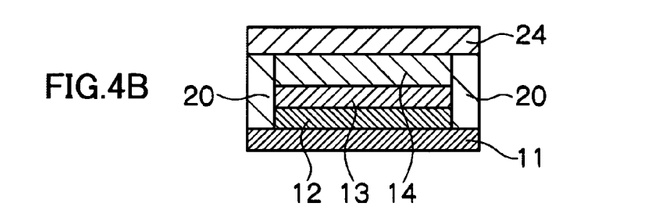
Figure 4C:
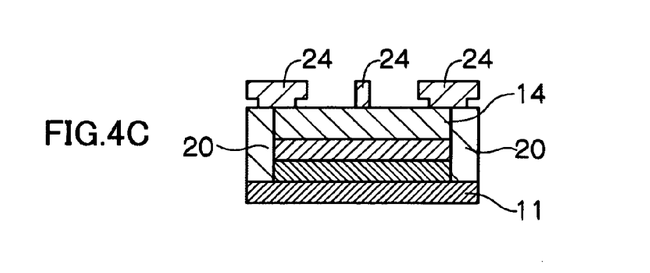
Figure 4D:
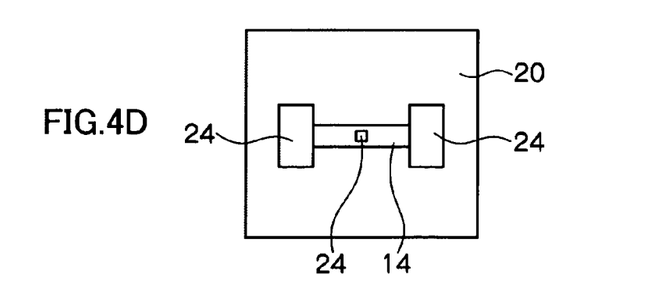

With reference to FIGS. 4A to 4E, a resist film 24 is applied (FIG. 4B) on the first ferromagnetic layer 14 shown as plan view in FIG. 4A. Thereafter, the layer structure including the resist film 24 is exposed to the electron beam by an exposure device. In this exposure, there will be utilized a mask having a predetermined pattern of the shape capable of leaving portions to which the nano-contact portion 28 and the electrode pad portion 22 of the first ferromagnetic layer 14. In the next step, a portion of the resist film 24 to which the etching treatment (ion milling, for example) will be effected is removed, which is shown by FIGS. 4C and 4D as sectional view and plan view.

Figure 4E:
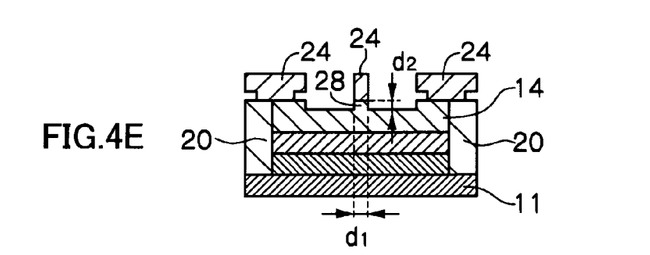

In the next step of FIG. 4E, the exposed portion of the first ferromagnetic layer 14 is etched so as to provide the nano-contact portion 28. It is preferred, as such etching treatment, to utilize the ion milling process, which is desired to carry out two times separately. That is, the first ion milling will be done from a direction normal to the first ferromagnetic layer 14 and the second ion milling will be then done by most properly setting an ion projection angle, a projection energy and an ion milling time so that the nano-contact portion 28 has the maximum dimension of not more than Fermi length. By forming the first ferromagnetic layer 14 through the etching process such as ion milling, the nano-contact portion 28 and the first ferromagnetic layer 14 can be formed of the same material. The magneto-resistance effect element 10 of the present invention can be manufactured easily.

According to this process, the nano-contact portion 28 having the dimension of not more than Fermi length can be formed. Accordingly, it becomes possible to detect signals with high sensitivity due to the BMR effect.

The nature and/or characters of such nano-contact portion 28 will be explained hereunder.

The nano-contact portion 28 is formed so as to have a shape of circle, elliptical, rectangular (triangle, square or so) or like supposing that the magnetoresistance effect element be viewed in a front-side plan view. In this meaning, the dimension, i.e., length, d1 of the nano-contact portion 28 will be considered to be equal to the maximum length d1 in the plane in which the nano-contact portion 28 exists, and accordingly, in the present invention, it will be said that the maximum length d1 of the nano-contact portion 28 is less than (not more than) the Fermi length.

The Fermi length being of the length d1 of the nano-contact portion 28 in its width direction is a value specific to material (specific value or characteristic value), which is different for each material constituting the ferromagnetic material forming the nano-contact portion 28. However, many kinds of such ferromagnetic materials have the Fermi length of about 60 nm to 100 nm, so that the words "less than the Fermi length" will be prescribed as "less than 100 nm" or "less than 60 nm". In fact, Ni has the Fermi length of about 60 nm and that of Co is of about 100 nm.

Furthermore, it is more desirable that the maximum length d1 of the nano-contact portion 28 in its width direction is less than a mean free path. Although the value of this mean free path is also a value specific to ferromagnetic materials constituting the nano-contact portions, many of them reside in a range of about 5 nm to 15 nm. Accordingly, in this meaning, the word "less than mean free path" will be prescribed substantially equivalently as "less than 15 nm" or "less than 5 nm". In concrete examples, NiFe has a mean free path of about 5 nm and that of Co is of about 12 nm.

Incidentally, it is also desirable that a length (distance) d2 of the nano-contact portion 28 in the layer lamination direction, i.e., vertical direction as viewed in the plane of FIG. 4E is also less than the Fermi length similar the length d1. More specifically, it is desired to be prescribed as being less than 100 nm or less than 60 nm, and moreover, it is further desirable for the length d2 to be prescribed to be less than the mean free path, i.e., less than 15 nm or less than 5 nm as mentioned above.

On the contrary, in a case that the lengths d1 and d2 in the width and lamination directions of the nano-contact portion 28 exceed the Fermi length, the thickness of the magnetic wall of the nano-contact portion 28 becomes large in the case that the magnetization shows an anti-parallel state, and hence, it becomes difficult for electron passing the nano-contact portion 28 to keep spin direction. As a result, in this meaning too, it may be difficult to attain the magnetoresistance effect based on the change in the relative direction of the free and pinned layers magnetizations. Accordingly, it is desirable for the preferred embodiment of the present invention that the dimension of the nano-contact portion 28 (d1 and d2) is less than the Fermi length, and especially, in the viewpoint of well keeping the spin information, it is less than the mean free path.

Further, on the other hand, in the case where the lengths d1 and d2 in the width and lamination directions of the nano-contact portion 28 are less than the Fermi length, a thin wall section is generated to the magnetic wall section of the nano-contact portion 28. Accordingly, relative relationship in magnetization arrangement between the first ferromagnetic layer 14 and a second ferromagnetic layer 32, which will be explained hereinafter, between which the nano-contact portion 28 is disposed, varies, and hence, electrical resistance between the first and second ferromagnetic layers 14 and 32 will also vary.

In the case of the magnetoresistance effect element 10 of the present invention, since, basically, there exists a magnetic field area, in which the electrical resistance is reduced in accordance with the magnetic field even if magnetic field applying direction be changed, it will be said that the magnetoresistance effect produced there is the effect which is produced by the magnetic wall formed to the nano-contact portion 28. Herein, the magnetic wall of the nano-contact portion 28 acts as a transition region or area of two portions (i.e., two ferromagnetic layers 14 and 32 with the nano-contact portion 28 being sandwiched therebetween) having different magnetized directions. Further, according to the present invention, the magneto-resistance effect more than 50% will be produced in accordance with the magnetized direction and magnitude of the applied magnetic field.

Since the magnetoresistance effect element, of the present invention, provided with such nano-contact portion 28 indicates a large rate of change in magnetoresistance (called magneto-resistance ratio), it is considered that electrons can ballistically pass through the nano-contact portion 28 without any scattering. Further, the magnetoresistance ratio mentioned above means an MR ratio ($\Delta R/R$), which is defined by an electrical resistance R at a time of sufficiently large magnetic strength and an electric resistance change $\Delta R$ at a time when an applied magnetic field is changed.

[Insulating Layer Forming Step]

The formation of the insulating layer 26 will be described hereunder with reference to FIGS. 5A to 5C.

The insulating layer 26 is formed to a recessed portion of the etched first ferromagnetic layer 14 (i.e., pinned layer) so as to surround the nano-contact portion 28.

Figure 5A:
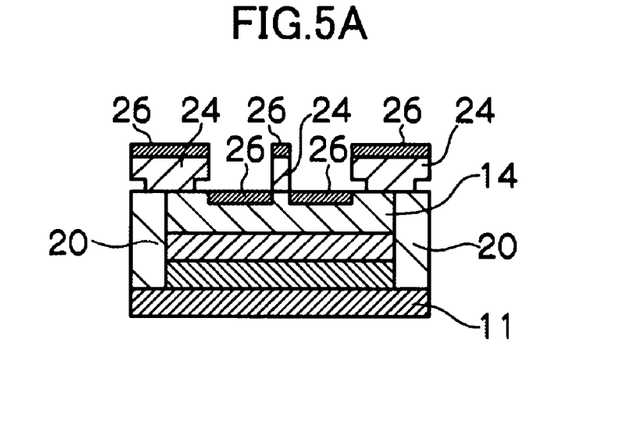
Figure 5B:
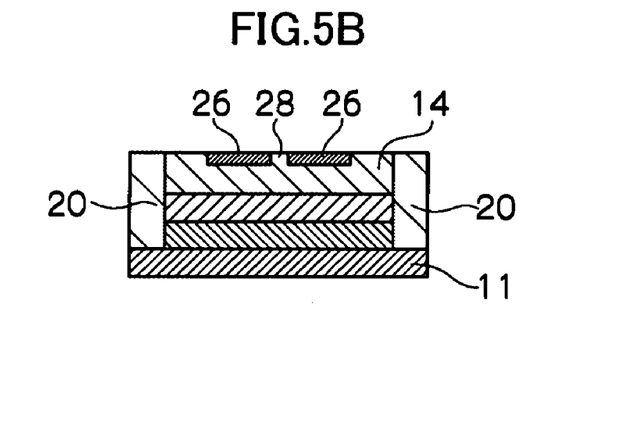
Figure 5C:
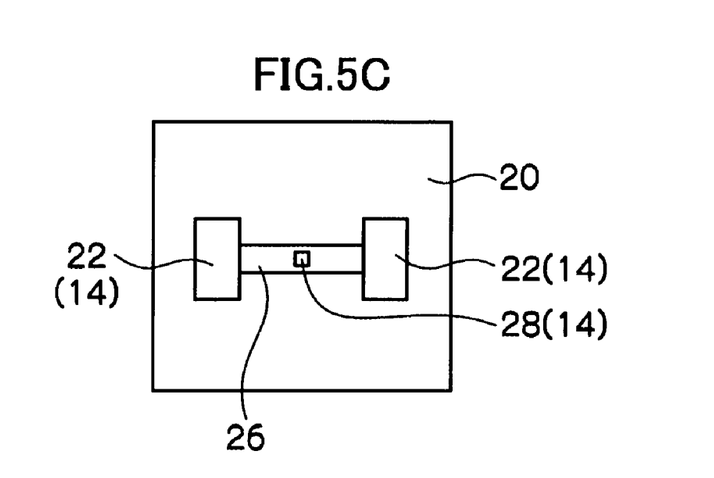

With reference to the sectional view of FIG. 5A, the insulating layer 26 is formed on the layer lamination structure after the formation of the nano-contact portion 28 (such as shown in FIG. 4E). This insulating layer 26 is formed of oxide such as aluminum oxide or silicon oxide, or nitride such as silicon nitride. The thus formed insulating layer 26 has a dimension, in the layer lamination direction, of the same length as that d1 of the nano-contact portion 28.

Thereafter, as shown in FIG. 4B (sectional view) and FIG. 4C (plan view), an unnecessary portion of the insulating layer 26 is left off together with the resist film 24. According to this lift-off, the insulating layer 26 is embedded in the recessed portion etched first ferromagnetic layer 14 (pinned layer) around the nano-contact portion 28.

[Second Ferromagnetic Layer Forming Step]

FIGS. 6A to 6D are views showing the steps of forming the second ferromagnetic layer 32 so as to contact the nano-contact portion 28. According to this second ferromagnetic layer formation step, a free layer provided, at its both ends, with electrode pad portions 36 is formed so as to provide a strip shape.

Figure 6A:
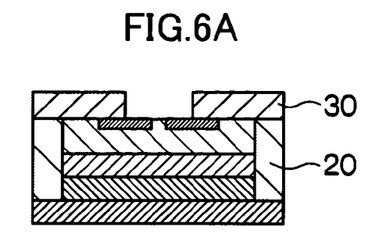
Figure 6B:
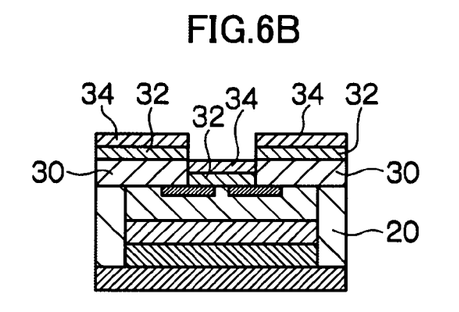

With first reference to the sectional view of FIG. 6A, a resist film 30 is formed, by the patterning step identical to that mentioned hereinbefore, to a portion other than the portion to which the second ferromagnetic layer 32 is formed. Then, as shown in the sectional view of FIG. 6B, the second ferromagnetic layer 32 is formed thereon and a top shield layer 34 may be further formed, as occasion demands, on the second ferromagnetic layer 32.

Figure 6C:
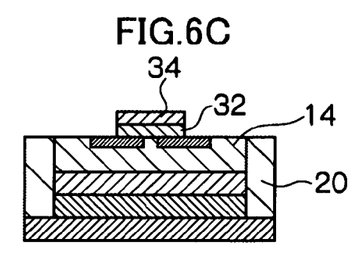
Figure 6D:
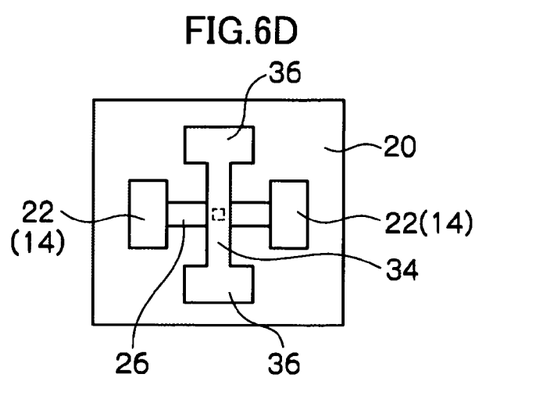

Thereafter, the second ferromagnetic layer 32 and the top shield layer 34, which are formed to the portions on which the formation thereof is not required, are lifted off together with the resist film 30 to thereby obtain the layer lamination structure such as shown in FIGS. 6C (sectional view) and 6D (plan view).

With the step mentioned above, the second ferromagnetic layer 32 will function as free layer. This free layer is a layer in which the magnetization is rotated or inverted sensitive to the magnetic field generated from the media magnetic field, and it is desirable to prescribe the direction of its easy axis to be parallel to the medium. Further, it may be possible to dispose single or two layers as such second ferromagnetic layer 32 forming the free layer.

That is, in the case of the single second ferromagnetic layer 32, it may be desired to from this second ferromagnetic layer of the same material as that of the first ferromagnetic layer 14, such as, for example, a material having a spin polarization of not less than 0.5 so as to provide a thickness of 0.5 to 5 nm, in usual.

On the other hand, in the case of the two ferromagnetic layers 32, not shown, these two layers are disposed in the ferromagnetic coupling state or anti-ferromagnetic coupling state. In the case of the ferromagnetic coupling state, one of these ferromagnetic layers disposed apart from the nano-contact portion 28 is formed of a material having a high spin polarization and the other one of them disposed in adjacent to the nano-contact portion 28 is formed of a soft magnetic material having a small magnetostriction. According to such combined formation, the high sensitivity and wide linear function can be effectively ensured. As a material having high polarization, it may be possible to use the various materials, such as mentioned above, having the spin polarization of not less than 0.5, and the material of CoFe or Co may be preferably used. The ferromagnetic layer 32 is usually formed so as to provide a thickness of 0.5 to 5 nm, and Ni, NiFeCo or NiFe will be preferably utilized as the soft material having small magnetostriction.

On the contrary, in the case of the anti-ferromagnetic state of the two ferromagnetic layers 32, not shown, a non-magnetic layer is disposed between these two ferromagnetic layers. The non-magnetic layer of such layer lamination is a layer for adjusting or regulating the degree of coupling between the two ferromagnetic layers, and the non-magnetic layer is formed of a material selected from the group consisting of, for example, Ru, Rh, Ir, Cu, Ag or Au, or an alloy thereof. These two ferromagnetic layers provide the anti-parallel coupling by forming the free layer consisting of two ferromagnetic layers between which the non-magnetic layer is interposed. According to such arrangement, the magnetization of these two ferromagnetic layers forming the free layer is stabilized, and, therefore, the magnetoresistance effect element having high stability can be provided.

Further, in a modification, a ferromagnetic layer, in the case of the anti-ferromagnetic coupling state, may be further provided on the second ferromagnetic layer 32 of a material such as CoFe or NiFe so as to have a thickness of 0.5 to 5 nm, in usual. The ferromagnetic layers and the non-magnetic layer in this step may be formed through a sputtering or ion beam deposition process.

Furthermore, it will be desired that the top shield layer 34 has a thickness of about 1 to 2 mm and is formed of a material of NiFe, NiFeMo or like.

[External Electrode Forming Step]

FIG. 7 is a sectional view showing a step for forming an electrode on the electrode pad. The magnetoresistance effect element according to the present invention will be completed as a product by finally patterning the external (outermost) electrode 38, which is preferably formed of a conductive metal material such as Ti, Ta or like so as to usually have a thickness of 10 to 100 nm.

Figure 8:
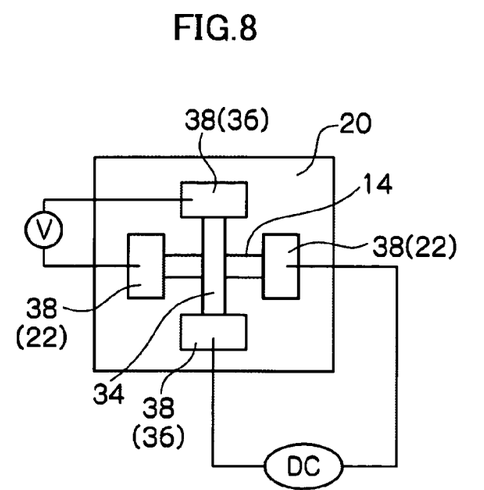
FIG. 8 is an illustration for evaluating the characteristics of the magnetoresistance effect element of FIG. 7.

FIG. 8 is an illustration for evaluating the characteristics of the thus manufactured magnetoresistance effect element. As shown, a direct current (DC) is applied between the one external electrode 38 formed to the first ferromagnetic layer 14 and one external electrode 38 formed to the second ferromagnetic layer 32 and the variation in the sensing current and voltage obtained by the D.C. application are measured and the MR ratio is evaluated.

[Magnetoresistance Effect Element]

Consequently, as mentioned above, the preferred one embodiment of the magnetoresistance effect element of the present invention comprises the structure such as shown in FIG. 7 (FIGS. 7A and 7B).

That is, the magnetoresistance effect element 10 generally comprises the substrate 11 and the layer lamination structure including the first ferromagnetic layer 14, in shape of strip, formed as the pinned layer, one or more than one (i.e., at least one) nano-contact portion 28 etched to the first ferromagnetic layer 14, the insulating layer 26 embedded in the recessed portion of the etched first ferromagnetic layer 14, and the second ferromagnetic layer 32, in shape of strip, disposed on the insulating layer 26 and formed as the free layer, in which the first and second ferromagnetic layers are each provided with electrode pads formed to both ends thereof.

In the preferred embodiment, the magnetoresistance effect element of the present invention may include the following structural features.

The anti-ferromagnetic layer 13 is disposed between the substrate 11 and the first ferromagnetic layer 14, and the shield layer 12 may be further disposed between the substrate 11 and the anti-ferromagnetic layer 13. The top shield layer 34 may be further disposed on the second ferromagnetic layer 32, and the external electrodes 38 are formed on the electrode pads 36.

The first ferromagnetic layer 14 formed as the pinned layer may preferably be composed of a single ferromagnetic layer 14 or two ferromagnetic layers 15 and 16 and the single non-magnetic layer 17 disposed between these two ferromagnetic layers 15 and 16.

The second ferromagnetic layer 32 formed as the free layer may also have substantially the same layer structure as that of the first ferromagnetic layer 14 as mentioned above. That is, it may be composed of a single ferromagnetic layer 14 or two ferromagnetic layers 15 and 16 and the single non-magnetic layer 17 disposed between these two ferromagnetic layers 15 and 16.

Further, a plurality of such first ferromagnetic layers, each in shape of strip, is provided on the substrate 11.

Further, in a more compact embodiment, it may be said that the magneto-resistance effect element 10 of the present invention comprises the first ferromagnetic layer 14 forming the pinned layer, the nano-contact portion 28, and the second ferromagnetic layer 32 forming the free layer, the nano-contact portion 28 being disposed between the first and second ferromagnetic layers 14 and 32 as well as insulating layer 26.

Still furthermore, the magnetoresistance effect element 10 of the present invention may be further provided with other layer or layers as occasion demands. For instance, a buffer layer, not shown in the drawings, is deposited just before the anti-ferromagnetic layer 13 for a better crystal growth and consequently for enhancing the pinning field strength.

In the above disclosure, the magnetoresistance effect element 10 of the present invention was described with reference to the preferred embodiment such as shown in FIGS. 7A and 7B; the following modifications may be adopted.

The first ferromagnetic layers 14 forming the pinned layer and the second ferromagnetic layer 32 forming the free layer may be substituted, in position, with each other in their layer lamination direction. Furthermore, these first and second ferromagnetic layers 14 and 32 may be provided with the functions of the electrode without disposing the external electrodes separately. In such arrangement, electrical resistance between the free layer and the pinned layer when current is conducted between the electrodes will vary in accordance with their relative arrangement of the magnetizations of the free and the pinned layers.

Further, the magnetoresistance effect element having further improved sensitivity can be provided. Moreover, since the first and second ferromagnetic layers 14 and 32 between which the nano-contact portion 28 is sandwiched has flat layer structures so as to easily control the magnetic domain, the magnetization distribution can be fairly regulated, and the sharpness of the magnetic wall width between these first and second ferromagnetic layers 14 and 32 can be maintained, thus achieving the large magnetic resistance ratio.

Furthermore, the present invention may include embodiments in which one or plural nano-contact portions 28 are arranged, and in the case where plural (more than one) nano-contact portions 28 are disposed between the first and second ferromagnetic layers 14 and 32, the MR value may be slightly reduced, but, in comparison with the arrangement of the single nano-contact portion 28, the scattering of the MR values in each element could be reduced, thus easily reproducing the stable MR characteristics.

[Magnetic Head]

A magnetic head (magneto-resistive head) formed by utilizing the magnetoresistance effect element of the present invention of the structures and characters mentioned above can provide a large reproduced sensitivity because, by utilizing such magnetoresistance effect element, the magnetoresistance ratio of more than 50% can be produced.

Figure 9:
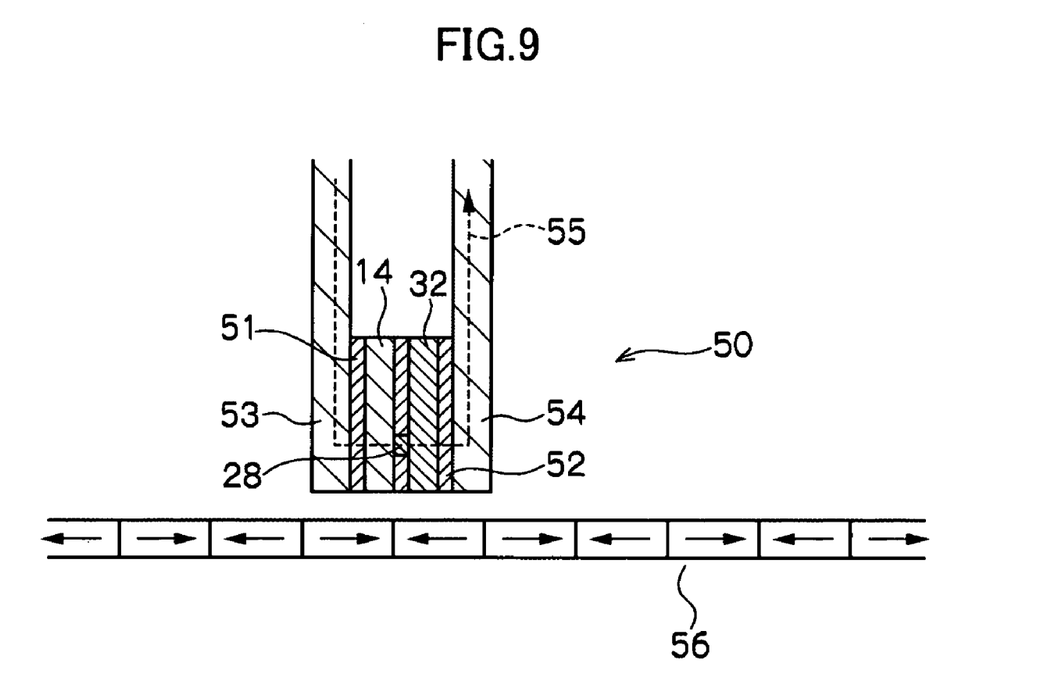
FIG. 9 is an illustrated sectional view of a magnetic head according to one embodiment of the present invention.

FIG. 9 is an illustrated example of an embodiment of the magnetic head utilizing the magnetoresistance effect element, such as shown in FIG. 7, of the present invention as a magnetic reproducing element.

With reference to FIG. 9, the magnetic head 50 of this embodiment comprises: the magnetoresistance effect element 10 including the first ferromagnetic layer 14 forming the pinned layer, the nano-contact portion 28, and the second ferromagnetic layer 32 forming the free layer; electrodes 51 and 52 disposed outside the first and second ferromagnetic layers 14 and 32; and shield members 53 and 54 both disposed further outside the electrodes 51 and 52. Reference numeral 55 shows a flow path of a sensing current.

More specifically, the magnetic head 50 includes the magnetoresistance effect element 10, as shown in FIGS. 7A and 7B, which comprises the substrate 11 and the layer lamination structure including the shield layer 12, the anti-ferromagnetic layer 13, the first ferromagnetic layer 14, one or more than one) i.e., at least one nano-contact portion 28 etched to the first ferromagnetic layer 14, the insulating layer 26 embedded in the recessed portion of the etched first ferromagnetic layer 14, the second ferromagnetic layer 32 disposed on the insulating layer and the top shield layer 34, which are laminated in this order on the substrate 11 and in which the first and second ferromagnetic layers are each provided with electrode pads formed at both ends thereof.

Such magnetoresistance effect element 10 may be disposed between the outer shield members 53 and 54 for forming the magnetic head 50.

In the magnetic head 50, the magnetoresistance effect element 10 is disposed so that the film surface thereof has a vertical arrangement with respect to a recording medium 56. In the illustrated arrangement, the nano-contact portion 28 is arranged in a direction approaching the recording medium 56 from the center of the magnetoresistance effect element 10. A magnetic field from the recording medium 56 becomes large as shortening the distance from the recording medium 56, and accordingly, the magnetic head having the structure in which the nano-contact portion 28 is disposed to such position provides a large magnetic field detection efficiency of the magnetic field of the second ferromagnetic layer 32 forming the free layer being sensitive to the magnetization, thus being effective and advantageous.

Furthermore, in the illustrated embodiment of FIG. 9, although a horizontal magnetized film is illustrated as the recording medium 56, it may be substituted with a vertical magnetized film.

The magnetoresistance effect element 10 of the embodiment shown in FIG. 9 has a width of 20 to 100 nm, and the respective layers constituting this element 10 having a thickness in the range of 0.5 to 20 nm may be optionally selected in accordance with the recording density and the required sensitivity to be utilized. Furthermore, the one or more nano-contact portions may be formed so as to provide the thickness of 1 to 20 nm.

As mentioned above, according to the magnetoresistance effect element mounted to the magnetic head of the present invention, the easy axis of the free layer arranged in 90 degrees along the cross track, and the magnetization of the easy axis is rotated in sensitive response to the magnetic field generated from the magnetization transition region of the recording medium in the case of longitudinal recording media and from the magnetization of the recorded bit in the case of perpendicular magnetic recording media. As a result, the leak field of the recording medium can be extremely sensitively read out Moreover, the magnetoresistance effect element can indicate the magnetoresistance effect more than 50%, thus providing the magnetic head with reduced sensitivity loss and with improved stability in function.

It is to be noted that the present invention is not limited to the described embodiment and many other changes and modifications may be made without departing from the scopes of the appended claims.

What is claimed is:

1. A method of manufacturing a magnetoresistance effect element comprising the steps of:
   preparing a substrate;
   forming a first ferromagnetic layer on the substrate;
   patterning the first ferromagnetic layer so as to form a pinned layer, in the shape of a strip, having both end portions to which electrode pads are formed;
   etching the pinned layer in two steps with different angles so as to form at least one nano-contact portion;
   embedding an insulating material to the etched pinned layer so as to form an insulating layer around the nano-contact portion;
   forming a second ferromagnetic layer so as to contact at least the nano-contact portion; and
   patterning the second ferromagnetic layer so as to form a free layer, in shape of strip, having both end portions to which electrode pads are formed.

2. A method of manufacturing a magnetoresistance effect element according to claim 1, wherein an anti-ferromagnetic layer is formed on the substrate before the formation of the first ferromagnetic layer.

3. A method of manufacturing a magnetoresistance effect element according to claim 1, wherein said first ferromagnetic layer forming step including a formation of either one of cases of forming a single ferromagnetic layer and forming two ferromagnetic layers between which a non-magnetic layer is further formed.

4. A method of manufacturing a magnetoresistance effect element according to claim 1, wherein said etching step to the pinned layer to form the nano-contact portion is effected by ion milling so that the maximum dimension of the nano-contact portion is not more than Fermi length.

5. A method of manufacturing a magnetoresistance effect element according to claim 4, wherein said ion milling process is carried out twice from directions different from each other.

6. A method of manufacturing a magnetoresistance effect element according to claim 1, wherein a plurality of pinned layers, each in the shape of a strip, provided at both end thereof with the electrode pads, are formed on the substrate in the patterning step for forming the pinned layer.

7. A method of manufacturing a magnetoresistance effect element according to claim 1, wherein said second ferromagnetic layer forming step including a formation of either one of cases of forming a single ferromagnetic layer and forming two ferromagnetic layers between which a non-magnetic layer is further formed.

8. A method of manufacturing a magnetoresistance effect element according to claim 1, further comprising the step of forming external electrodes on the electrode pads, respectively.

9. A method of manufacturing a magnetoresistance effect element according to claim 1, wherein the ferromagnetic layers of die pinned layer and the free layer, as well as the nano-contact portion, are each formed of a material selected from the groups consisting of a ferromagnetic metal group of Co, Fe, Ni, CoFe, NiFe, CoFeNi; a ferromagnetic metalloid group of CrO2; and a ferromagnetic oxide of Fe3O4.

* * * * *

UNITED STATES PATENT AND TRADEMARK OFFICE
CERTIFICATE OF CORRECTION

PATENT NO. : 7,206,174 B2
APPLICATION NO. : 10/882179
DATED : April 17, 2007
INVENTOR(S) : Rachid Sbiaa et al.

It is certified that error appears in the above-identified patent and that said Letters Patent is hereby corrected as shown below:

| Column | Line | |
|---|---|---|
| 1 | 24 | Change "more large" to --a larger--. |
| 1 | 33 | Change "a continuous" to --is continuous--. |
| 1 | 37 | After "search" insert --for--. |
| 1 | 40 | Change "have been" to --has been--. |
| 2 | 17 | Change "tens" to --tenths of--. |
| 2 | 19 | Change "1 Tbits/in2" to -- 1 Tbits/in$^2$--. |
| 4 | 26 | Change "both end" to --both ends--. |
| 6 | 15 | After "ferromagnetic" insert --layer--. |
| 6 | 24 | Change "or like" to --or the like--; change "in usual" to --usually--. |
| 6 | 43 | Change "that also" to --also that,--. |
| 6 | 44 | Before "using" insert --when--; change "flowed" to --followed--; change "such Ru, Rh" to --such as Ru or Rh,--. |
| 6 | 62 | Change "CrO2" to --$CrO_2$--; change "Fe3O4" to --$Fe_3O_4$-- |
| 6 | 66 | After "deposition" insert --process--. |
| 7 | 6 | After "such" insert --as--. |
| 7 | 11 | Change "in usual" to --as usual--. |
| 7 | 16 | Change "in usual" to --as usual--. |

UNITED STATES PATENT AND TRADEMARK OFFICE
CERTIFICATE OF CORRECTION

PATENT NO. : 7,206,174 B2
APPLICATION NO. : 10/882179
DATED : April 17, 2007
INVENTOR(S) : Rachid Sbiaa et al.

It is certified that error appears in the above-identified patent and that said Letters Patent is hereby corrected as shown below:

| | | |
|---|---|---|
| 8 | 7 | Change "constitutes" to --constitute--. |
| 9 | 14 | After "similar" insert --to--. |
| 9 | 25 | Change "electron" to --electrons--. |
| 9 | 29 | Change "layers" to --layers'--. |
| 10 | 54 | Change "from" to --form--. |
| 14 | 59 | Change "both end" to --both ends--. |
| 15 | 7 | Change "die pinned" to --the pinned--. |
| 16 | 4 | Change "CrO2" to --$CrO_2$--; change "Fe3O4" to --$Fe_3O_4$--. |

Signed and Sealed this

Twenty-fifth Day of March, 2008

JON W. DUDAS
*Director of the United States Patent and Trademark Office*